US009395582B2

(12) United States Patent
Chen et al.

(10) Patent No.: US 9,395,582 B2
(45) Date of Patent: Jul. 19, 2016

(54) MASK AND METHOD OF FABRICATING SPACERS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaochuan Chen, Beijing (CN); Hailin Xue, Beijing (CN); Chuncheng Che, Beijing (CN); Wenbo Jiang, Beijing (CN); Yue Li, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 23 days.

(21) Appl. No.: 14/416,430

(22) PCT Filed: May 26, 2014

(86) PCT No.: PCT/CN2014/078461
§ 371 (c)(1),
(2) Date: Jan. 22, 2015

(87) PCT Pub. No.: WO2015/043214
PCT Pub. Date: Apr. 2, 2015

(65) Prior Publication Data
US 2015/0316797 A1    Nov. 5, 2015

(30) Foreign Application Priority Data

Sep. 24, 2013   (CN) .......................... 2013 1 0438678

(51) Int. Cl.
*G02F 1/1339*    (2006.01)
*G02B 5/30*    (2006.01)
(Continued)

(52) U.S. Cl.
CPC ................ *G02F 1/1339* (2013.01); *G02B 5/00* (2013.01); *G02B 5/3083* (2013.01); *G02F 1/13394* (2013.01); *G03F 1/26* (2013.01); *G03F 7/2002* (2013.01)

(58) Field of Classification Search
CPC ..... G02F 1/13394; G02F 1/1339; G03F 1/26; G03F 7/20; G03F 7/2002
USPC ............... 430/320, 321, 325, 396, 5; 349/156
See application file for complete search history.

(56) References Cited

U.S. PATENT DOCUMENTS

2006/0099522 A1   5/2006   Park et al.
2008/0160427 A1   7/2008   Kim
2009/0023081 A1   1/2009   Kawashima

FOREIGN PATENT DOCUMENTS

CN        1591182 A        3/2005
CN        1881076 A       12/2006
(Continued)

OTHER PUBLICATIONS

Computer-generated translation of KR 2012-0133131 (Dec. 2012).*
(Continued)

*Primary Examiner* — John A McPherson
(74) *Attorney, Agent, or Firm* — Collard & Roe, P.C.

(57) ABSTRACT

A mask and a method of fabricating spacers (2) using the mask (1). The mask (1) comprises a light transmitting region including an array of light transmitting holes (230), a light non-transmitting region and a phase shifting layer (240) formed in one of two adjacent light transmitting holes (230) of the mask for shifting phrase of lights passing through the light transmitting holes (230). Thus, a light intensity can be reduced or lowered to zero when the lights pass through a diffractive region of the two adjacent light transmitting holes (230). Therefore, a bridging effect between two adjacent spacers (2) is alleviated and even avoided during fabricating the spacers (2).

4 Claims, 2 Drawing Sheets

(51) Int. Cl.
   *G03F 7/20* (2006.01)
   *G03F 1/26* (2012.01)
   *G02B 5/00* (2006.01)

(56) References Cited

FOREIGN PATENT DOCUMENTS

| | | | |
|---|---|---|---|
| CN | 101211107 A | | 7/2008 |
| CN | 101592827 A | | 12/2009 |
| CN | 103365070 A | | 10/2013 |
| CN | 103454850 A | | 12/2013 |
| EP | 2 017 670 A1 | | 1/2009 |
| JP | 2006-39121 A | | 2/2006 |
| JP | 2010-008532 A | * | 1/2010 |
| KR | 2012-0133131 A | * | 12/2012 |
| WO | 2013/058385 A1 | | 4/2013 |
| WO | WO 2014-061674 A1 | * | 4/2014 |

OTHER PUBLICATIONS

Computer-generated translation of WO 2014-061674 (Apr. 2014).*
Computer-generated translation of JP 2010-008532 (Jun. 2010).*
English Translation of the International Search Report of PCT/CN2014/078461 published in English on Apr. 2, 2015.
Chinese Office Action of Chinese Application No. 201310438678.3, mailed Nov. 26, 2014 with English translation.
International Search Report and Written Opinion of the International Searching Authority with Notice of Transmittal of the International Search Report and Written Opinion of PCT/CN2014/078461 in Chinese, mailed Sep. 1, 2014.
The Notification to Grant the Patent Right (Notice of Allowance) for CN 201310438678.3 issued on Apr. 15, 2015 in Chinese with an English translation.
The Issued Patent for CN 103454850 B (Application No. CN 201310438678.3) which was granted on May 27, 2015 in Chinese with the Chinese granted claims with an English translation.
English translation of the International Preliminary Report on Patentability and Written Opinion of the International Searching Authority of PCT/CN2014/078461, issued Mar. 29, 2016.

* cited by examiner

MASK AND METHOD OF FABRICATING SPACERS

CROSS REFERENCE TO RELATED APPLICATIONS

This application is the National Stage of PCT/CN2014/078461 filed on May 26, 2014, which claims priority under 35 U.S.C. §119 of Chinese Application No. 201310438678.3 filed on Sep. 24, 2013, the disclosure of which is incorporated by reference.

FIELD

The present disclosure relates to a mask and a method of fabricating spacers.

BACKGROUND

As pixel per inch (PPI) of existing liquid crystal display (LCD) is increasing, the distance between adjacent spacers is getting closer in a case where at least one spacer for supporting liquid crystal cell is ensured in each sub pixel.

SUMMARY OF THE INVENTION

The embodiment of the present disclosure provides a mask. The mask comprises a light transmitting region including an array of light transmitting holes, a light non-transmitting region and a phase shifting layer formed in one of two adjacent light transmitting holes of the mask for shifting phrase of lights passing through the light transmitting hole.

In an example, the phase shifting layer is formed in a region corresponding to each interval of each column and each row of the light hole of the mask.

In an example, the phase shifting layer is configured so that the lights passing through the adjacent light transmitting holes have a phase difference of 180°.

In an example, the phase shifting layer satisfies following formula:

$$\Delta\Phi = 2\pi(n-1)d/\lambda,$$

where $\Delta\Phi$ is a phase shift angle, d is a thickness of the phase shifting layer, n is a refractive index of the phase shifting layer and $\lambda$ is a wavelength of the lights.

In an example, the phase shifting layer has a thickness of about 350 Å~450 Å.

In an example, the phase shifting layer is formed of an oxide material containing molybdenum, silicon and nitrogen.

The embodiment of the present disclosure further provides a method of fabricating spacers comprising following steps. A spacer material film is formed on a substrate. The spacer material film in a region where a spacer array is to be formed is irradiated by using a mask so that the spacer material film in the region is cured to form a pattern of the spacer array. The mask comprises a light transmitting region including an array of light transmitting holes, a light non-transmitting region and a phase shifting layer formed in one of two adjacent light transmitting holes of the mask for shifting phrase of lights passing through the light transmitting hole. And then the uncured spacer material is removed.

The phase shifting layer for shifting phrase of lights passing through the light transmitting hole is formed in one of two adjacent light transmitting holes in each row and each column of the array of the light transmitting holes of the mask according to the embodiments of the present disclosure. Thus, the light intensity of the lights passing through the two adjacent light transmitting holes in a diffractive region between the two adjacent light transmitting holes is reduced or lowered to even zero. Therefore, a bridging effect between two adjacent spacers is alleviated and even avoided during fabricating the spacers.

BRIEF DESCRIPTION OF THE DRAWINGS

FIG. 2b is a schematic cross-sectional view taken along line A-A in FIG. 2a;

DESCRIPTION OF THE EMBODIMENTS

Figure 1:
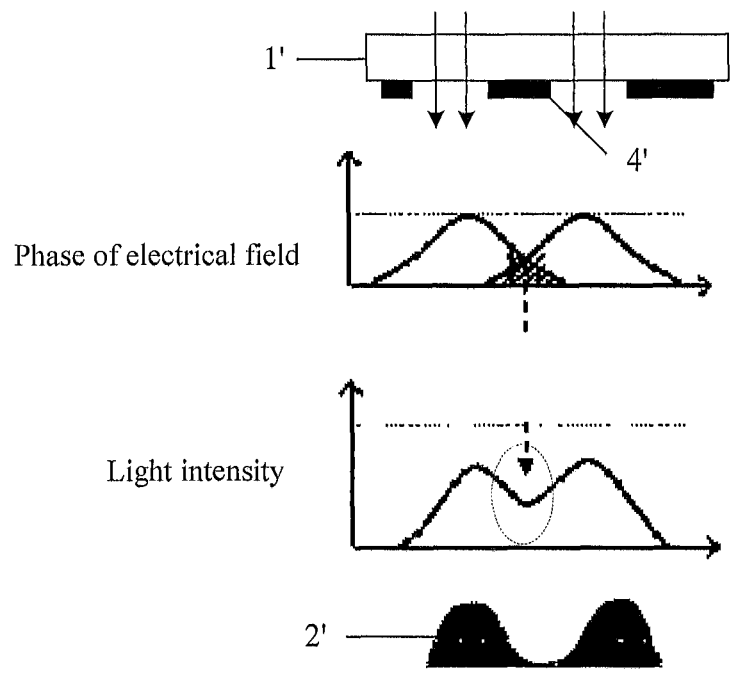
FIG. 1 is a schematic principle illustration showing an bridging effect between two adjacent spacers in a method of fabricating spacers in a high PPI product known by the inventor.

The technical solution of the embodiments of the present disclosure will be described clearly and fully in connection with the drawings of the embodiments of the present disclosure. It is obvious that the described embodiments are just a part but not all of the embodiments of the present disclosure. Based on the described embodiments of the present disclosure, those skilled in the art can obtain all other embodiment without any inventive work, which all fall into the scope of the claimed invention. The following embodiments are used to illustrate the present disclosure, not to limit the scope of the present disclosure. It is noted that the size, shape, the thickness and the like of the mask according to the embodiments of the present disclosure illustrated in the drawings are not used to limit the structure of the mask.

Unless otherwise defined, technical terms or scientific terms used herein shall have a common meaning known by those skilled in the art of the present disclosure. Words and expressions such as "first", "second" and the like used in the description and claims of the patent application of the present disclosure do not denote any sequence, quantity or importance, but distinguish different components. Likewise, words such as "a", "an" and the like do not denote quantitative restrictions, but denote the presence of at least one. Words such as "connected", "connecting" and the like are not restricted to physical or mechanical connections, but may include electrical connections, regardless of direct or indirect connections. Words such as "up", "below", "left", "right", etc., are only used to denote the relative positional relationship. Upon the absolute position of the described object changes, the relative positional relationship change correspondingly.

As illustrated in FIG. 1, in case where spacers 2' on a color filter substrate of a high PPI (the PPI is over 400) product are fabricated, the distance between two adjacent light transmitting holes 4' of a mask 1' corresponding to two adjacent spacers 2' is close. During exposing process, lights passing through the two adjacent light transmitting holes 4' are diffracted. As illustrated in FIG. 1, due to the diffraction, the light intensity overlays in a region between two adjacent light transmitting holes 4' such that a certain light intensity arises in a light non-transmitting region between two adjacent light transmitting holes 4'. The material of the spacer 2' in such region remains partially after exposure. Therefore, a bridging effect occurs between the two adjacent spacers 2'.

The bridging effect increases a bottom size of the spacer and reduces an elastic deformation of the spacer. When the spacers vary in height and the amount of liquid crystal does not vary correspondingly during mass production, due to the reduction of the elastic deformation of the spacer and deficiency of the liquid crystal, voids occur locally in the liquid crystal display device. In case of large bottom size of the spacer, in a rubbing alignment process, the spacers form a blocked region in a reverse direction of rubbing so that the alignment in the blocked region becomes abnormal, thus causing a light leakage in the region. Therefore, bridging effect of the spacers can easily lead to defects such voids and light leakage in the liquid crystal display device during fabricating process of a high PPI product.

Figure 2A:
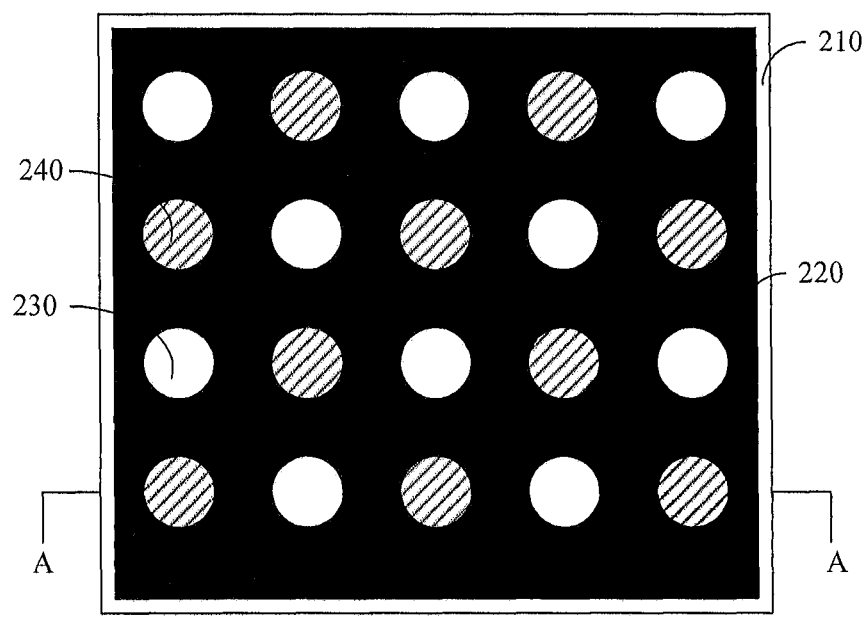
FIG. 2a is a schematic plan view of a mask according to an embodiment of the present disclosure.
Figure 2B:
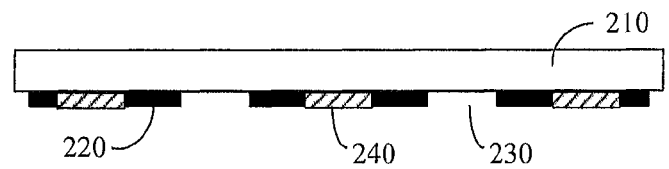

As illustrated in FIGS. 2a and 2b, a mask 1 according to an embodiment of the present disclosure comprises a light transmitting substrate 210 and a mask pattern layer 220 on the light transmitting substrate 210. The light transmitting substrate 210 can be a glass substrate or a quartz substrate and the like. In a further embodiment, the mask can be formed of only the mask pattern layer 220 without the light transmitting substrate 210. In this case, the light transmitting region is a cutout region. In this embodiment, the light transmitting region is formed by an array of a number of light transmitting holes 230. In a high PPI product, each sub pixel has correspondingly one spacer 2. The distance between the two adjacent spacers 2 is close and the distance between the two adjacent light transmitting holes 230 is correspondingly close. Thus, the lights passing through the two adjacent light transmitting holes 230 are diffracted in a diffraction region between the two adjacent light transmitting holes 230. In order to avoid the overlay of the lights passing through the two adjacent light transmitting holes 230 in the diffraction region, a phase shifting layer 240 is formed in one of two adjacent light transmitting holes 230 in the mask. As illustrated in FIG. 2a, the phase shifting layer 240 is formed in every other light transmitting hole of each column and each row of the light transmitting holes 230 of the mask.

It is noted that in the embodiments of the present disclosure, the spacers 2 have a cylinder shape, and the light transmitting holes of the mask have a circle shape by way of example. The light transmitting holes of the mask can have a shape of a triangle, rectangle, ellipse and the like, and the spacer 2 has a cross sectional shape of such shape accordingly. The embodiments of the present disclosure do not limited thereto.

The phase shifting layer 240 is configured so that the lights passing through the adjacent light transmitting holes 230 have a phase shift, alleviating or avoiding overlays of light intensities in the diffraction region (that is, a corresponding light non-transmitting region of the mask) between two adjacent light transmitting holes, so that the bridging effect between the two adjacent spacers 2 is alleviated and even avoided during fabricating the spacers. The phase shifting layer 240 can be formed of a material with a phase shifting property such as an oxide containing for example, molybdenum, silicon and nitrogen.

In an example, in order to completely avoid the bridging effect between the two adjacent spacers 2, the phase shifting layer 240 is configured so that the lights passing through the adjacent light transmitting holes 230 have a phase difference of 180°. The light intensity in the diffraction region between the two adjacent light transmitting holes 230 is reduced or lowered to substantially zero, so that the bridging effect between the two adjacent spacers 2 is avoided.

Figure 3:
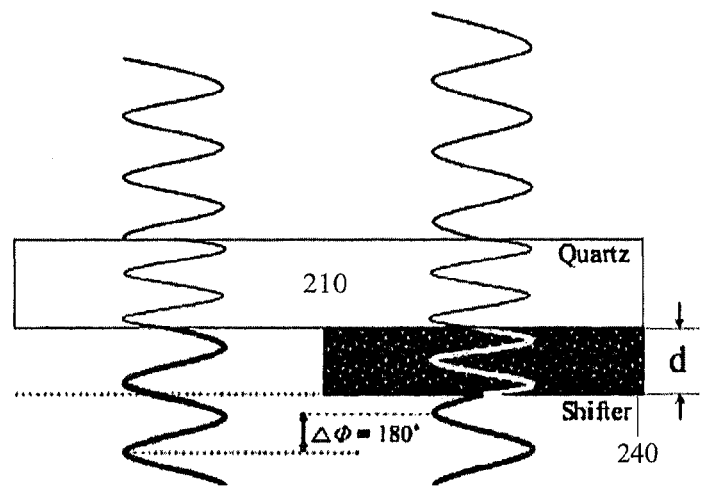
FIG. 3 is schematic principle illustration showing a phase shifting with a mask according to the embodiments of the present disclosure.
Figure 4:
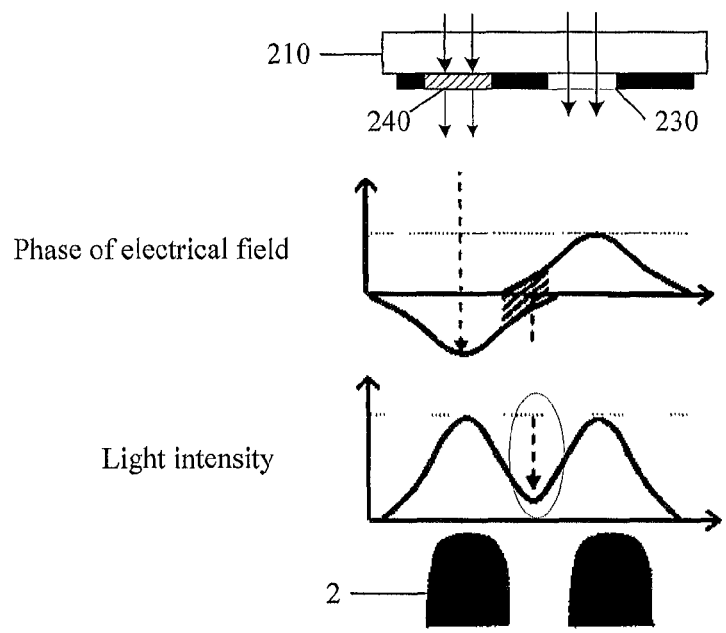
FIG. 4 is a schematic principle illustration showing no bridging effect between two adjacent spacers in the method of fabricating the spacers according to the embodiment of the present disclosure.

As illustrated in FIGS. 3 and 4, the phase shifting layer 240 with a thickness of d in FIG. 3 is configured so that the lights passing through the adjacent light transmitting holes have a phase shift angle of $\Delta\Phi : \Delta\Phi = 2\pi(n-1)d/\lambda$, where n is a refractive index of the phase shifting layer and $\lambda$ is a wavelength of the lights. In the diffraction region of FIG. 4, when $\Delta\Phi$ is 180°, the light intensity is zero so that no bridging effect between the two adjacent light holes occurs.

In an example, the phase shifting layer can be configured to have a thickness of about 350 Å~450 Å (for example, 400 Å), which ensures the transmittance of the lights passing through the phase shifting layer 240 to be above 99%.

It is noted that in the embodiments of the present disclosure, the spacer is formed corresponding to the light transmitting holes of the mask. In this case, the exposed spacer material is cured to form the spacer 2, and the uncured portion of the spacer material is readily to be removed. For example, the spacer material is a negative photoresist material. In a further embodiment, the spacer material can be a positive photoresist material. The positive photoresist spacer material is readily removed after exposure whereas uncured portion of the positive photoresist spacer material remains to form the spacer 2. In this case, a region where the spacer 2 is formed corresponds to a light non-transmitting region of the mask, and a phase shifting layer is formed in one of the two light transmitting regions which are adjacent to each column or each row of the light non-transmitting regions. The principle is the same as the one described above, which will not be repeated herein.

The embodiment of the present disclosure further provides a method of fabricating spacers. The method comprises the following steps.

In a first step, a spacer material film is formed on a substrate. The substrate can be a color filter substrate or an array substrate. The spacer material can be an elastic resin material and the like.

It is noted that the color filter substrate formed with color filters or the array substrate formed with a thin film transistor array is referred as an upper and lower substrates of a display panel. The spacer according to the embodiments of the present disclosure can be formed on an upper substrate or a lower substrate with other structures, such as an array substrate integrated with color filters, a packaging substrate and the like. The present disclosure does not limited thereto.

In a second step, the spacer material film is irradiated in a region where a spacer array is to be formed by using a mask, so that the spacer material film in the region is cured to form a pattern of the spacer array. The light transmitting region of the mask corresponds to the region where the spacer array is formed, and a phase shifting layer is formed in a region of one of the two adjacent light transmitting holes in the mask so that the lights passing through the light transmitting holes have a phase difference.

The phase shifting layer is formed of a material have a phase shifting property such as a light transmitting oxide for example containing molybdenum, silicon and nitrogen.

In an example, in order to completely avoid the bridging effect between the two adjacent spacers 2, the phase shifting layer 240 is configured so that the lights passing through the adjacent light transmitting holes 230 have a phase difference of 180°. The light intensity in a diffraction region between the two adjacent light transmitting holes 230 is reduced or lowered to substantially zero, so that the bridging effect between the two adjacent spacers 2 is avoided.

As illustrated in FIGS. 3 and 4, the phase shifting layer 240 with a thickness of d in FIG. 3 is configured so that the lights passing through the adjacent light transmitting holes have a phase shift angle of $\Delta\Phi$: $\Delta\Phi=2\pi(n-1)d/\lambda$, where n is a refractive index of the phase shifting layer and $\lambda$ is a wavelength of the lights. In the diffraction region of FIG. 4, when $\Delta\Phi$ is 180°, the light intensity is zero so that no bridging effect between the two adjacent light transmitting holes occurs.

In an example, the phase shifting layer can be configured to have a thickness of about 350 Å~450 Å, for example, 400 Å, which ensures the transmittance of the lights passing through the phase shifting layer 240 to be above 99%.

In a third step, the uncured spacer material is removed.

Since the spacer material film in the region corresponding to the light non-transmitting region of the mask is not exposed and cured, a developing solution can be used to dissolve and remove it.

It is noted that in the present disclosure, a negative photoresist material is used as the spacer material. That is, it is cured to form the spacer pattern after exposure and thus it is not dissolved in the developing solution. The spacer material according to the embodiment can be a positive photoresist material. Then the design of the mask is adjusted correspondingly. That is, the light transmitting regions and the light non-transmitting regions of the mask are designed contrary to that of the mask configured for the negative photoresist spacer material. The phase shifting layer is configured in one of the two light transmitting regions which are adjacent to each column or each row of the light non-transmitting regions. The principle is the same as the one described above, which is not repeated herein.

The above embodiments are only used to illustrate but not to limit the present disclosure. Those who skilled in the art can make various change and modification without departing from the spirit and scope of the present disclosure. Therefore, all equivalent technical solutions fall into the scope of the present disclosure. The claimed scope the present disclosure is defined by the appending claims.

The present application claims the priority of the Chinese patent application No. 201310438678.3 filed on Sep. 24, 2013, which is incorporated as part of the present application by reference herein in its entirety.

What is claimed is:

1. A method of fabricating spacers, comprising:
   forming a spacer material film on a substrate;
   irradiating the spacer material film in a region where a spacer array is to be formed, by using a mask, so that the spacer material film in the region is cured to form a pattern of the spacer array, the mask comprising a light transmitting region including an array of light transmitting holes corresponding to the region of the spacer array, a light non-transmitting region; and a phase shifting layer formed in one of two adjacent light transmitting holes of the mask for shifting phrase of lights passing through the light transmitting hole; and
   removing the uncured spacer material.

2. The method of claim 1, wherein the phase shifting layer satisfies following formula:

$$\Delta\phi=2\pi(n-1)d/\lambda,$$

where $\Delta\phi$ is a phase shift angle, d is a thickness of the phase shifting layer, n is a refractive index of the phase shifting layer and $\lambda$ is a wavelength of the lights.

3. The method of claim 2, wherein the phase shifting layer is configured so that the lights passing through the adjacent light transmitting holes have a phase difference of 180°.

4. The method of claim 3, wherein the phase shifting layer has a thickness of about 350 Å-450 Å.

* * * * *